(12) United States Patent
Antonov et al.

(10) Patent No.: US 8,841,747 B2
(45) Date of Patent: Sep. 23, 2014

(54) CAPACITOR STRUCTURE WITH METAL BILAYER AND METHOD FOR USING THE SAME

(75) Inventors: Vassil Antonov, Boise, ID (US); Vishwanath Bhat, Boise, ID (US); Chris Carlson, Nampa, ID (US)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 244 days.

(21) Appl. No.: 13/090,277

(22) Filed: Apr. 20, 2011

(65) Prior Publication Data

US 2012/0267757 A1    Oct. 25, 2012

(51) Int. Cl.
*H01L 21/02*      (2006.01)
*H01L 49/02*      (2006.01)

(52) U.S. Cl.
CPC .............. *H01L 28/65* (2013.01); *H01L 28/75* (2013.01)
USPC .................. 257/532; 257/516; 257/E21.008; 438/393

(58) Field of Classification Search
USPC ........................................................ 257/296
IPC ............ H01L 28/65,28/75; H01G 4/008, 9/042, H01G 9/058
See application file for complete search history.

(56) References Cited

U.S. PATENT DOCUMENTS

| | | | |
|---|---|---|---|
| 7,378,329 B2 * | 5/2008 | Nakazawa et al. | 438/396 |
| 2003/0183153 A1 * | 10/2003 | Kim et al. | 117/4 |
| 2005/0277208 A1 | 12/2005 | Nakazawa | |
| 2010/0078693 A1 * | 4/2010 | Nakao | 257/295 |
| 2010/0196592 A1 * | 8/2010 | Kim et al. | 427/79 |
| 2010/0254179 A1 * | 10/2010 | Kim | 365/149 |

FOREIGN PATENT DOCUMENTS

| | | |
|---|---|---|
| TW | I232523 | 5/2005 |
| TW | 200616905 | 6/2006 |
| TW | 200644171 | 12/2006 |

* cited by examiner

*Primary Examiner* — Eva Y Montalvo
(74) *Attorney, Agent, or Firm* — Winston Hsu; Scott Margo

(57) ABSTRACT

A method for using a metal bilayer is disclosed. First, a bottom electrode is provided. Second, a dielectric layer which is disposed on and is in direct contact with the lower electrode is provided. Then, a metal bilayer which serves as a top electrode in a capacitor is provided. The metal bilayer is disposed on and is in direct contact with the dielectric layer. The metal bilayer consists of a noble metal in direct contact with the dielectric layer and a metal nitride in direct contact with the noble metal.

10 Claims, 4 Drawing Sheets

CAPACITOR STRUCTURE WITH METAL BILAYER AND METHOD FOR USING THE SAME

BACKGROUND OF THE INVENTION

1. Field of the Invention

The present invention relates to a novel capacitor structure and a method of using the capacitor structure in a semiconductor device. More particularly, the present invention is directed to a novel capacitor structure with substantially improved capacitance, increased high frequency capacitance stability, reduced leakage and smaller charge trapping, and a method of using the capacitor structure with a bilayer working electrode in a semiconductor device.

2. Description of the Prior Art

MIM (Metal-Insulator-Metal) capacitors are essential passive components for use in a wide variety of electronic devices. For example, electronic applications such as Dynamic random access memory (DRAM), analog integrated circuits, and radio frequency (RF) circuits all may have one or more MIM (Metal-Insulator-Metal) capacitors.

Dynamic random access memory (DRAM) is a semiconductor device which includes at least one transistor and one capacitor. In order to improve the capacitance of the capacitor and the possibility to downscale the dimensions of the dynamic random access memory, it is critical to increase the capacitance and other electric properties of the capacitors. Further, some additional properties of the capacitors, such as high frequency capacitance stability, leakage and inverse hysteresis should be improved as well.

As the technology advances, the demand for larger capacitance density has become higher in order to facilitate the shrinkage of the devices and to reduce the production cost. To meet this demand, there are many theoretical possibilities. For example, candidate materials of higher dielectric constant (high-k) may serve as the dielectric layer disposed between the top electrode and the bottom electrode. Suitable materials may be $Hfo_2$, $ZrO_2$, $Ta_2O_5$, $Nb_2O_5$, or $SrTiO_3$.

Another possible way to increase the capacitance of the capacitors is to reduce the thickness of the dielectric layer. However, there is a physical limit when reducing the thickness of the dielectric layer because a capacitor with an insufficient thickness often fails due to lack of reliability.

Although ruthenium metal is considered as a prospective electrode material for use in gate stacks in view of its higher work function, lower resistivity, and ease of patterning via dry etch, this material is often associated with an undesirable decrease in capacitance, namely capacitance loss in terms of increase in EOT (equivalent oxide thickness). Also, for a capacitor for use in a high frequency capacitance purpose, the capacitance needs to be stable at high frequency.

As a result, there is still a need to have a novel capacitor structure with a substantially better capacitance, increased high frequency capacitance stability, reduced leakage and smaller inverse hysteresis for use in different challenging purposes.

SUMMARY OF THE INVENTION

The present invention accordingly proposes a novel capacitor structure and a method of using the capacitor structure with composite materials in a semiconductor device, in particular for use in MIM (Metal-Insulator-Metal) capacitors. The capacitor structure of the present invention has a bilayer material serving as a working top electrode, to demonstrate a substantially better capacitance, increased high frequency capacitance stability, reduced leakage or smaller inverse hysteresis in a resultant capacitor.

The present invention in a first aspect proposes a capacitor structure. The capacitor structure includes an upper electrode, a cap layer, a lower electrode, and a dielectric layer. The upper electrode substantially consists of a noble metal, such as Pt, Pd, Ir or Ru. The cap layer substantially consists of a metal nitride such as titanium nitrate (TiN) or tantalum nitride (TaN) and directly covers the upper electrode. The lower electrode includes a conductive material such as a metal. The dielectric layer is disposed between the upper electrode and the lower electrode and at the same time is in direct contact with the upper electrode and the lower electrode.

In a first embodiment of the present invention, the noble metal is in a zero valent state, for example, in an elemental state. In a second embodiment of the present invention, the noble metal has a thickness ranging between 10 Å-40 Å. In a third embodiment of the present invention, the metal nitride has a thickness ranging between 20 Å-50 Å. In a fourth embodiment of the present invention, a top electrode which includes the upper electrode and the cap layer has a thickness ranging between 75 Å-90 Å. In a fifth embodiment of the present invention, the dielectric layer is in direct contact with the noble metal. In a sixth embodiment of the present invention, the upper electrode is free of W. In a seventh embodiment of the present invention, the upper electrode is free of Si.

The present invention in a second aspect proposes a method for using a metal bilayer. First, a bottom electrode is provided. Second, a dielectric layer disposed on and in direct contact with the lower electrode is provided. Then, a metal bilayer which serves as a top electrode in a capacitor is provided. The metal bilayer is disposed on and is in direct contact with the dielectric layer. The metal bilayer consists of a noble metal indirect contact with the dielectric layer and a metal nitride in direct contact with the noble metal.

In a first embodiment of the present invention, the noble metal is in a zero valent state, for example, in an elemental state. In a second embodiment of the present invention, the noble metal is Pt, Pd, Ir or Ru. In a third embodiment of the present invention, the noble metal has a thickness ranging between 10 Å-40 Å. In a fourth embodiment of the present invention, the metal nitride is titanium nitrate (TiN) or tantalum nitride (TaN). In a fifth embodiment of the present invention, the metal nitride has a thickness ranging between 20 Å-50 Å. In a sixth embodiment of the present invention, the metal bilayer has a thickness ranging between 75 Å-90 Å. In a seventh embodiment of the present invention, the upper electrode is free of W or Si.

These and other objectives of the present invention will no doubt become obvious to those of ordinary skill in the art after reading the following detailed description of the preferred embodiment that is illustrated in the various figures and drawings.

DETAILED DESCRIPTION

The present invention provides a method of integrating ruthenium into a top electrode stack in a way to preserve a sufficiently thin EOT while demonstrating benefits in terms of leakage and high frequency capacitance stability. The method includes building a top electrode stack comprised of a relatively thin (about 10 Å-40 Å) layer of Ru inserted between a high-k dielectric and a cap layer of a thin nitride (about 20 Å-50 Å) layer. It is important to keep the Ru layer thin enough to avoid an increase in EOT. In addition, the nitride layer should also be sufficiently thin in order not to dominate the electronic properties of the metal stack. An added benefit of this method is the reduced consumption of Ru precursor.

Figure 1:
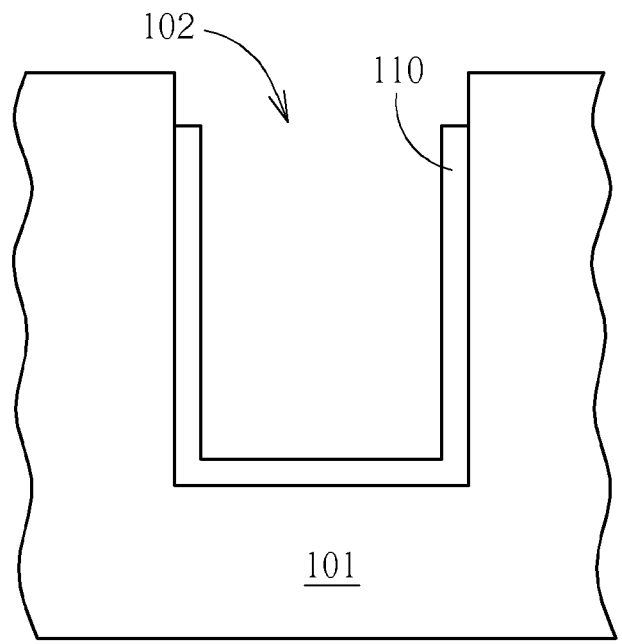
FIGS. 1-3 illustrate a method for using a metal bilayer of the present invention in a capacitor.
Figure 2:
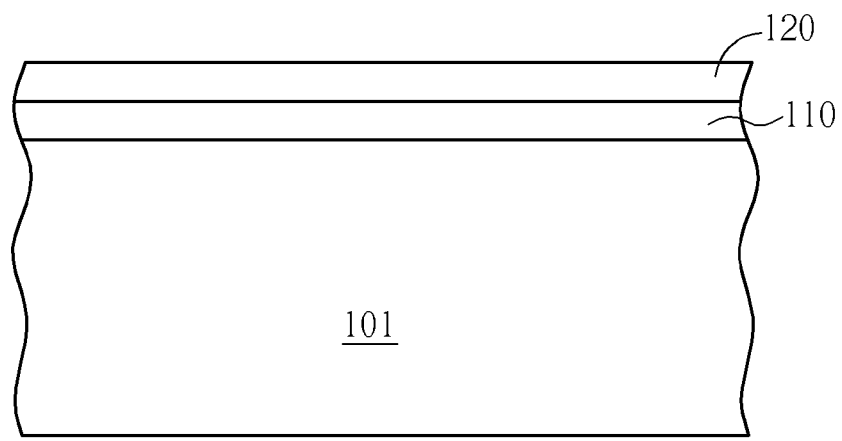
Figure 3:
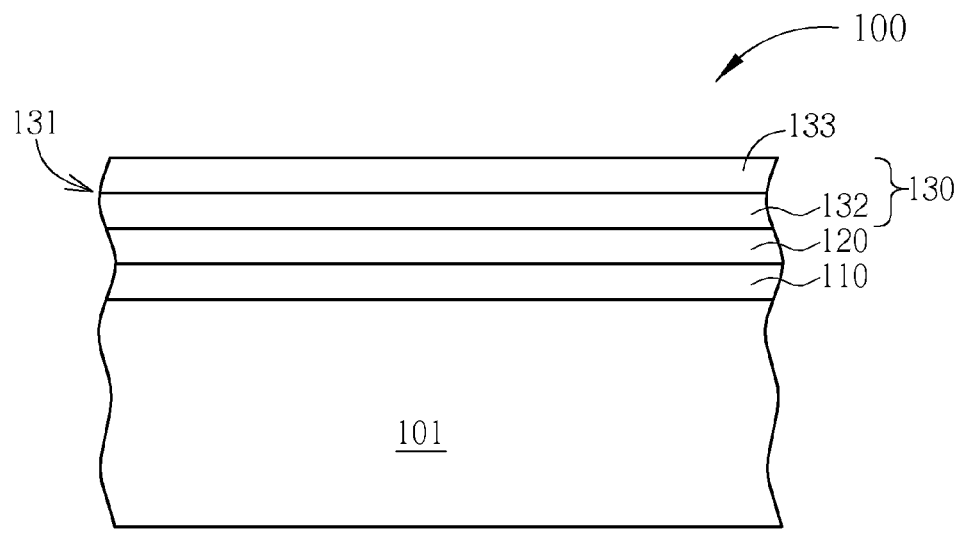

The present invention in a first aspect provides a method for using a metal bilayer in a capacitor. FIGS. 1-3 illustrate the method for using a metal bilayer of the present invention in a capacitor. First, as shown in FIG. 1, a bottom electrode 110 is provided. The bottom electrode 110 is formed on a substrate 101. Optionally, the bottom electrode 110 may be formed in a trench 102 of the substrate 101. The bottom electrode 110 may be formed of any suitable conductive material, such as, but not limited to, metals, metal alloys, conductive metal oxides, and mixtures thereof. In some embodiments, the bottom electrode may be formed of the same material as the conductive material of the top electrode 132, or the cap layer 133. The bottom electrode may be formed by any process known in the art including, but not limited to, ALD and CVD. The substrate 101 may be a dielectric material. The trench 102 may be the trench of a deep trench capacitor or a stack capacitor, in a dynamic random access memory (DRAM) for example.

Second, as shown in FIG. 2, a dielectric layer 120 is formed. The dielectric layer 120 may be disposed on a flat bottom electrode 110 so it is in direct contact with the bottom electrode 110. The dielectric layer 120 may consist of oxides or oxynitrides of Si, Ge, Al, or of any transition metal, or any mixture, laminate, or combination thereof. The dielectric layer may be formed by any process known in the art, such as, but not limited to, ALD.

Then, as shown in FIG. 3, a metal bilayer 130 stack is directly formed on the dielectric layer 120. The metal bilayer 130 serves as a working top electrode 131 in a capacitor 100, so the metal bilayer 130 is disposed on and is in direct contact with the dielectric layer 120. The bottom electrode 110, the dielectric layer 120 and the working top electrode 131 together form the capacitor 100.

The metal bilayer 130 consists of a noble metal 132, i.e. an upper electrode 132 which is in direct contact with the dielectric layer 120 and a metal nitride 133 in direct contact with the noble metal 132. The metal bilayer 130 has a suitable thickness, for example ranging between 75 Å-90 Å.

The noble metals 132 are metals which are more difficult to be oxidized than regular metals, so the noble metal 132 may be Pt, Pd, Ir or Ru, or the noble metal 132 is free of an unsuitable material, such as W or Si. Preferably, the noble metal 132 is in a zero valent state. In other words, the noble metal 132 is in an elemental state, rather than in an oxidized or reduced state. For example, the noble metal 132 may be ruthenium but not ruthenium oxide. The noble metal 132 has a suitable thickness, for example ranging between 10 Å-40 Å. It is important to keep the noble metal 132 sufficiently thin to avoid an increase in EOT. The noble metals 132 may be formed by an atomic layer deposition (ALD).

The metal nitride 133 serves as a cap layer to cover the noble metal 132 and, along with the noble metal 132, serves as the working top electrode 131 in the capacitor 100. The working top electrode 131 exclusively has two layers, namely the noble metal 132 which is in direct contact with the dielectric layer 120 and the metal nitride 133 in direct contact with the noble metal 132. The metal nitride 133 is a conductive nitride, for example any suitable transition metal nitride including but not limited to, TiN, TaN, ZrN, HfN, NbN and MoN. In addition, the metal nitride 133 has a suitable thickness, for example ranging between 20 Å-50 Å. The metal nitride 133 should also be sufficiently thin in order not to dominate the electronic properties of the metal stack.

After the above steps are completed, a capacitor structure 100 is obtained. Please refer to FIG. 3. The capacitor structure 100 includes an upper electrode 132, a cap layer 133, a lower electrode 110, and a dielectric layer 120. The upper electrode substantially consists of a noble metal, such as Pt, Pd, Ir or Ru, and has a thickness ranging between 10 Å-40 Å.

The cap layer 133 substantially consists of a metal nitride such as titanium nitrate (TiN) or tantalum nitride (TaN) and directly covers the upper electrode. The cap layer 133 has a thickness ranging between 20 Å-50 Å. The lower electrode 110 includes a conductive material such as a metal. The dielectric layer 120 is disposed between the upper electrode 132 and the lower electrode 110. The dielectric layer 120 is at the same time in direct contact with the upper electrode 132 and the lower electrode 110.

Figure 4:
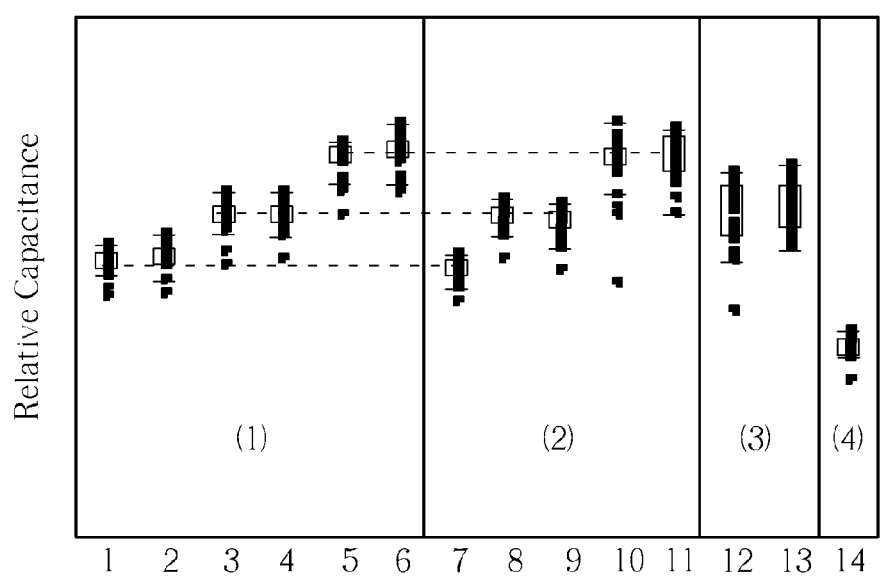
FIG. 4 shows a comparison of capacitance among different examples of the invention.

The combination of the upper electrode 132 and the cap layer 133 forms a capacitor 100 with excellent properties. FIG. 4 shows the comparison of capacitance among (1) Samples 1-6 all have TiN/W/Poly composite top electrode, (2) Samples 7-11 have 25 Å-Ru/TiN composite top electrode, (3) Samples 12-13 have 50 Å-Ru/TiN composite top electrode and (4) Sample 14 has 50 Å-Ru top electrode. The dashed lines emphasize the equivalent capacitance observed with TiN/W/Poly and with 25 Å-Ru/TiN top electrodes when combined with the same capacitor dielectric. In particular, sample 7 has the same dielectric as samples 1 and 2; samples 8 and 9 have the same dielectric as samples 3 and 4; samples 10 and 11 have the same dielectric as 5 and 6. Samples 12 and 13 have the same dielectric as samples 5, 6, 10 and 11, but show reduced capacitance due to the use of thicker Ru in the top electrode (50 Å-Ru/TiN). Sample 14 has the same dielectric as samples 5, 6, 10, 11, 12 and 13, and sample 14 shows a severe loss of capacitance due to the use of single layer 50 Å-Ru top electrode.

In conclusion, the results show that the stack of 25 Å-Ru/50 Å-TiN has matched capacitance to the TiN/W/Poly TCP composite top electrode. Ru/TiN top electrode with thick (50 Å) Ru shows some loss of capacitance. 50 Å Ru-only top electrode shows severe loss of capacitance.

Figure 5:
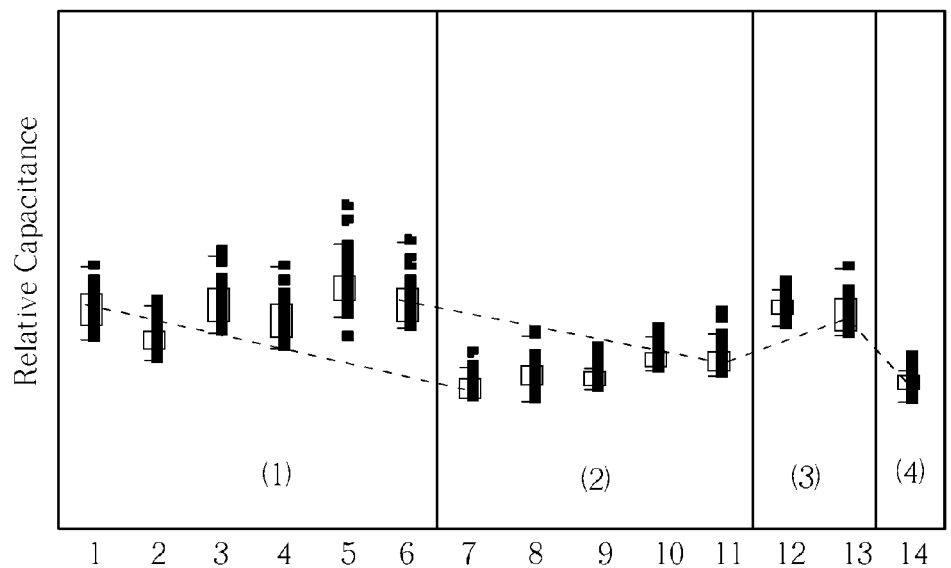
FIG. 5 shows a comparison of high frequency capacitance stability among different examples of the invention.

FIG. 5 shows the comparison of high frequency capacitance stability among (1) Samples 1-6 all have TiN/W/Poly composite top electrode, (2) Samples 7-11 have 25 Å Ru/TiN composite top electrode, (3) Samples 12-13 have 50 Å Ru/TiN composite top electrode and (4) Sample 14 has 50 Å-Ru top electrode. High frequency capacitance stability is measured in terms of percentage drop of capacitance from 3 kHz to 30 kHz, normalized to capacitance and read at 10 kHz (CF). The results show that sufficiently thin Ru in Ru/TiN top electrode provides reduced CF as compared to TiN/W/Poly composite top electrode.

Figure 6:
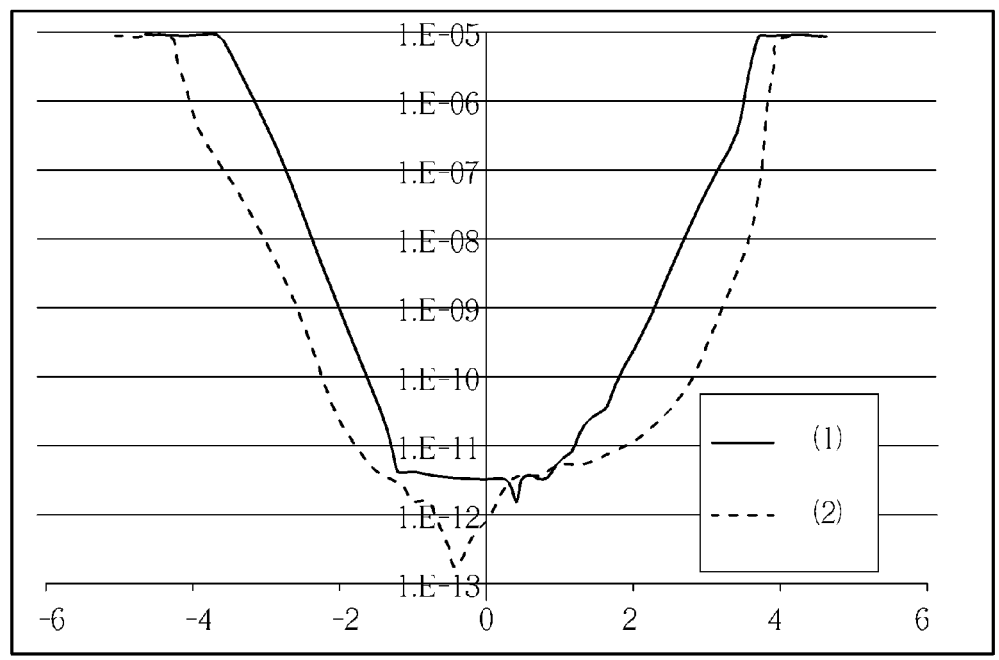
FIG. 6 shows a comparison of leakage among different examples of the invention.

FIG. 6 shows the comparison of leakage among (1) TiN/W/Poly composite top electrode and (2) 25 Å Ru/TiN composite top electrode. Fresh site I-V sweeps shows the advantage of reduced leakage with Ru/TiN composite top electrode over TiN/W/Poly composite top electrode, especially at higher bias.

Figure 7:
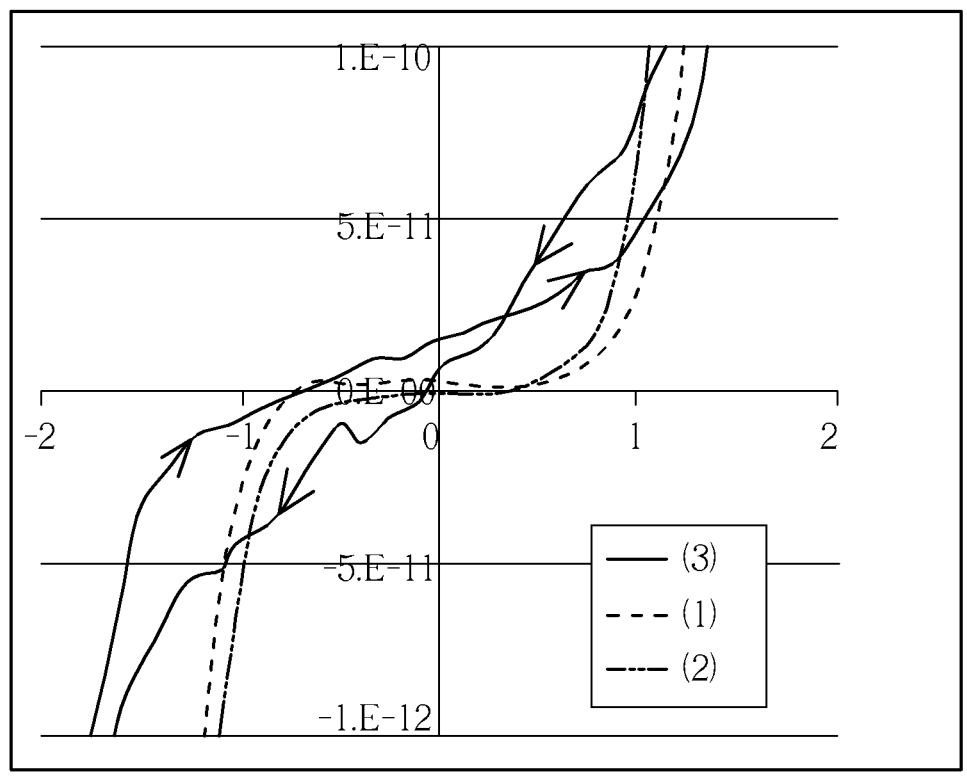
FIG. 7 shows a comparison of charge trapping among different examples of the invention.

FIG. 7 shows the comparison of charge trapping among (1) TiN/W/Poly composite top electrode, (2) 25 Å Ru/TiN composite top electrode, and (3) 50 Å Ru top electrode. Same site I-V cycling shows evidence for severe charge trapping issue with pure Ru top electrode, which is likely responsible for the capacitance loss. Ru/TiN top electrode shows small inverse hysteresis, and is comparable to TiN/W/Poly composite top electrode.

As evidenced by the above figures, the novel capacitor structure of the present invention demonstrates a substantially improved capacitance, increased high frequency capacitance stability, and reduced leakage or smaller inverse hysteresis.

Those skilled in the art will readily observe that numerous modifications and alterations of the device and method may be made while retaining the teachings of the invention.

What is claimed is:

1. A capacitor structure, comprising:
   an upper electrode substantially consisting of a single noble metal having a first thickness;
   a cap layer substantially consisting of a metal nitride and directly covering said upper electrode, wherein the upper electrode and the cap layer together act as a working top electrode of the capacitor structure, wherein the cap layer has a second thickness, and wherein the first thickness is to avoid an increase of equivalent oxide thickness (EOT), and the second thickness is to not dominate electronic properties of the working top electrode;
   a lower electrode comprising a conductive material, wherein said cap layer is not simultaneously in direct contact with said upper electrode and with said lower electrode; and
   a dielectric layer disposed between and in direct contact with said upper electrode and said lower electrode, wherein the dielectric layer consists of oxides or oxynitrides of Si, Ge, or Al.

2. The capacitor structure of claim 1, wherein said noble metal comprises Pt, Pd, Ir or Ru.

3. The capacitor structure of claim 1, wherein said noble metal has the first thickness ranging between 10 Å-40 Å.

4. The capacitor structure of claim 1, wherein said metal nitride comprises at least one of TiN, TaN, ZrN, HfN, NbN and MoN.

5. The capacitor structure of claim 1, wherein said metal nitride has the second thickness ranging 20 Å-50 Å.

6. The capacitor structure of claim 1, wherein the working top electrode has a thickness ranging between 75 Å-90 Å.

7. The capacitor structure of claim 1, wherein said dielectric layer is in direct contact with said noble metal.

8. The capacitor structure of claim 1 for use in a dynamic random access memory.

9. The capacitor structure of claim 1, wherein said upper electrode is free of W.

10. The capacitor structure of claim 1, wherein said upper electrode is free of Si.

* * * * *